(12) United States Patent
Kelkar et al.

(10) Patent No.: US 7,479,777 B2
(45) Date of Patent: Jan. 20, 2009

(54) CIRCUITRY AND METHOD TO MEASURE A DUTY CYCLE OF A CLOCK SIGNAL

(75) Inventors: Mukul Kelkar, West Sacramento, CA (US); Andrew M. Volk, Granite Bay, CA (US); Rajesh Kanakath, Folsom, CA (US); Vui Y. Liew, Penang (MY)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 11/648,488

(22) Filed: Dec. 28, 2006

(65) Prior Publication Data

US 2008/0162062 A1 Jul. 3, 2008

(51) Int. Cl.
*G06M 1/10* (2006.01)
*H03L 7/00* (2006.01)
*H03L 7/08* (2006.01)
*G01R 25/00* (2006.01)

(52) U.S. Cl. .................... 324/76.62; 327/160; 327/175; 702/79

(58) Field of Classification Search ............... 324/76.63
See application file for complete search history.

(56) References Cited

U.S. PATENT DOCUMENTS 3,866,120 A * 2/1975 Ford ........................... 324/175
5,757,218 A * 5/1998 Blum ......................... 327/175
6,088,811 A 7/2000 Liew et al.
6,791,428 B2 9/2004 Senthilkumar et al.
7,363,178 B2 * 4/2008 Boerstler et al. ............... 702/79
7,400,130 B2 * 7/2008 Naujokat et al. ......... 324/76.62
2005/0110453 A1 * 5/2005 Lecky ......................... 320/101

OTHER PUBLICATIONS

Intel® ICH Family Real Time Clock (RTC) Accuracy and Considerations under Test Conditions, Application Note—AP-728, May 2006, 22 pages.
Kelkar et al—U.S. Appl. No. 11/393,468, filed Mar. 29, 2006—Measuring And Identifying Analog Characteristics Of A Microelectronic Component At A Wafer Level And A Platform Level.

* cited by examiner

*Primary Examiner*—Vincent Q Nguyen
*Assistant Examiner*—Jeff Natalini
(74) *Attorney, Agent, or Firm*—Alan K. Aldous

(57) ABSTRACT

In some embodiments, a chip includes clock generation circuitry to create a clock signal, and reference signal oscillator circuitry to produce a reference signal with a higher frequency than the clock signal. The chip includes a counter to change a count value in response to changes in the reference signal; and count logic circuitry to cause count storage circuitry to read the count value in response to at least some changes in the clock signal and to make at least some of the values in the count storage circuitry related to a duty cycle of the clock signal available to an external tester. Other embodiments are described and claimed.

20 Claims, 5 Drawing Sheets

CIRCUITRY AND METHOD TO MEASURE A DUTY CYCLE OF A CLOCK SIGNAL

FIELD

Embodiments of the inventions relate generally to measuring the duty cycle of a clock signal.

BACKGROUND

Some integrated circuit chips have clock signal generation circuits on the chip (sometimes called a die.) The clock signal may be used for various purposes on the chip. As an example, the clock signal generation circuit may be a self-oscillating clock circuit and the clock signal may be referred to as a real time clock (RTC) signal. See, for example, Intel® ICH Family Real Time Clock (RTC) Accuracy and Considerations under Test Conditions, Application Note—AP-728, May 2006. In some chips, this clock generation circuit has had a history of problems. It can be very sensitive to silicon processing parameters as well as package and board variations.

Different approaches have been used to provide a test related to whether the clock generation circuit for a particular chip will work properly or fail. One approach is to use external testing equipment to measure the duty cycle of the RTC signal and use the duty cycle as an indicator as to whether the chip will fail. However, this approach has the following disadvantages. First, expensive external equipment is needed. In some cases, this equipment may be used anyway for other purposes, but not in all cases. Second, the RTC signal may get distorted within the chip and may lead to a different result by the time it gets to the external tester than it would within the chip. Third, changing designs may miss routing this signal outside the chip. Fourth, adjustments to the test interface unit (TIU) board adjustments may need to be done.

Another approach is to measure other characteristics than duty cycle. For example, in a currently used test suite, there is some observability of functionality of the RTC clock signal generation circuit but relatively little functionality to assess its performance and particularly its marginality. The test suite focuses on characteristics other than duty cycle, such as leakage. However, leakage might not be a good indicator as to whether the clock signal generation circuit will fail. Other characteristics may be too conservative and not a good test of whether the clock signal generation circuit will fail.

Yet another approach is to provide an on-die oscilloscope. This has the following disadvantages. First, the on-die oscilloscopes can take a relatively large amount of chip area. Second, although the accuracy of a good oscilloscope may be a benefit, the output still needs to be digitized for decision making.

Finally, phase locked loop (PLL) characterization circuits have been used. Again, although these characterizations may be useful for some purposes, they do not give the same information as the duty cycle measurements.

BRIEF DESCRIPTION OF THE DRAWINGS

The inventions may be understood by referring to the following description and accompanying drawings that are used to illustrate some embodiments of the inventions. However, the inventions are not limited to the details of these drawings.

DETAILED DESCRIPTION

In some embodiments, the inventions involve circuits and methods for measuring a duty cycle of a clock signal. The inventors have noticed that the duty cycle of the RTC clock is a good predictor of the health of the RTC clock generation circuit. The duty cycle of the RTC clock will be different with process variations. Toward process extremes (corners), the duty cycle can become more and more unbalanced and eventually stop toggling as a clock completely. In some embodiments, duty cycle measuring circuitry inside the chip measures the duty cycle and a testing system assigns the chip to different categories based, at least in part, on the measured duty cycle. In some embodiments, the categories are merely acceptable or unacceptable. In other embodiments, there are more grades such as acceptable, marginal, and unacceptable. In some embodiments, this involves a built-in-self-test, and the external tester does not need specific capability for the evaluation, in other implementations, an external tester has some specific capabilities directed to evaluating a chip based on duty cycle measurements.

Figure 1:
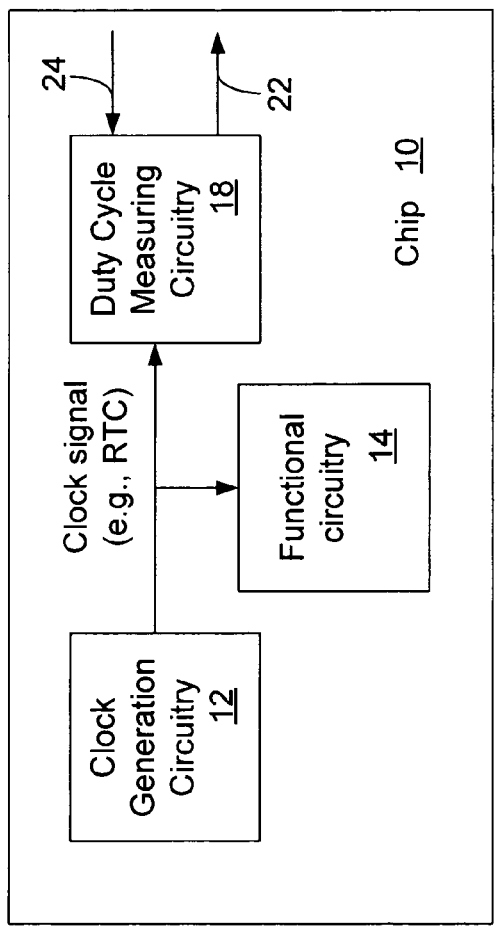
FIG. 1 is a block diagram representation of a chip including a clock generation circuit, functional circuitry, and duty cycle measuring circuitry according to some embodiments of the inventions.

Referring to FIG. 1, a chip 10 includes clock generation circuitry 12 that produces a clock signal that may be used for various purposes such as being used by functional circuitry 14. Duty cycle measuring circuitry 18 measures the duty cycle of the clock signal that is generated by clock generation circuitry 12. As an example, the clock signal may be a Real Time Clock (RTC), but the invention is not limited to measure the duty cycle of an RTC signal. Indeed, clock generation circuitry 12 may generate other types of clock signals that are not RTC signals.

Figure 2:
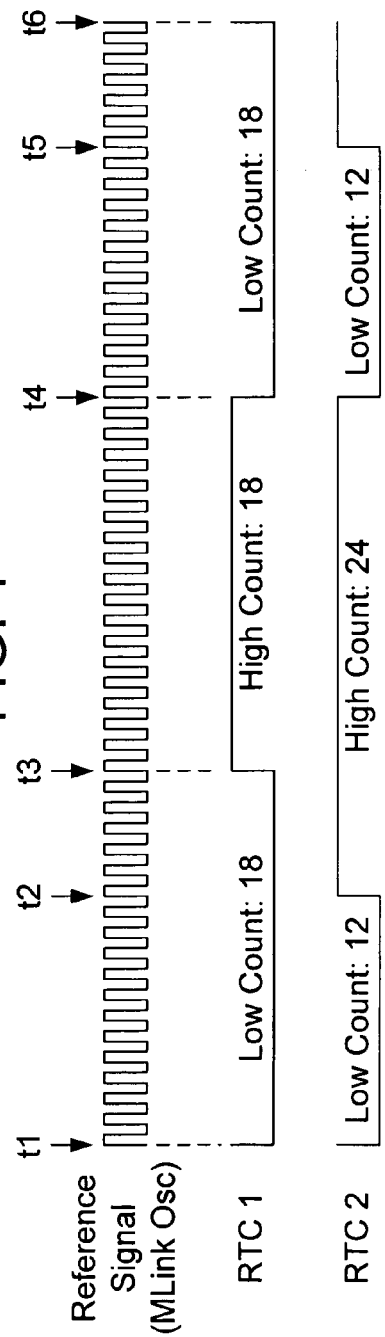
FIG. 2 is a graphical representation of a reference clock and two representations of a clock whose duty cycle is being measured according to some embodiments of the inventions.

FIG. 2 illustrates a reference signal, which in this example is referred to as a MLink Osc (manageability link oscillator) signal, but the inventions are not limited to this particular reference signal. Indeed, the invention can be implemented with a reference signal, that is not an MLink Osc signal. Two different clock signals (RTC 1 and RTC 2) are illustrated. RTC 1 has a duty cycle of 50% (18:18=50:50), with 18 reference clock cycles occurring during low portions of the clock signal (e.g., between times t1 and t3, and between times t4 and t6), and 18 reference clocks cycles occurring during high portions of the clock signal (e.g., between times t3 and t4). Accordingly, both the low count and the high count are 18. By contrast, RTC 2 has a duty cycle of 33% (12:24=33:67), with 12 reference clock cycles occurring during low portions of the clock signal (e.g., between times t1 and t2, and between times t4 and t5), and 24 reference clock cycles occurring during a high portion of the clock signal (e.g., between times t2 and t4). Accordingly, the low count is 12 and the high count is 24. For many purposes, a 50% duty cycle is considered a good duty cycle and a 33% duty cycle is considered a poor duty cycle, but that is not necessarily the case. Other clock signals could have different duty cycles. There may be a feedback path between reference signal oscillator 32 and oscillator clocks and state machine 30. (See, for example, FIG. 5.)

Figure 3:
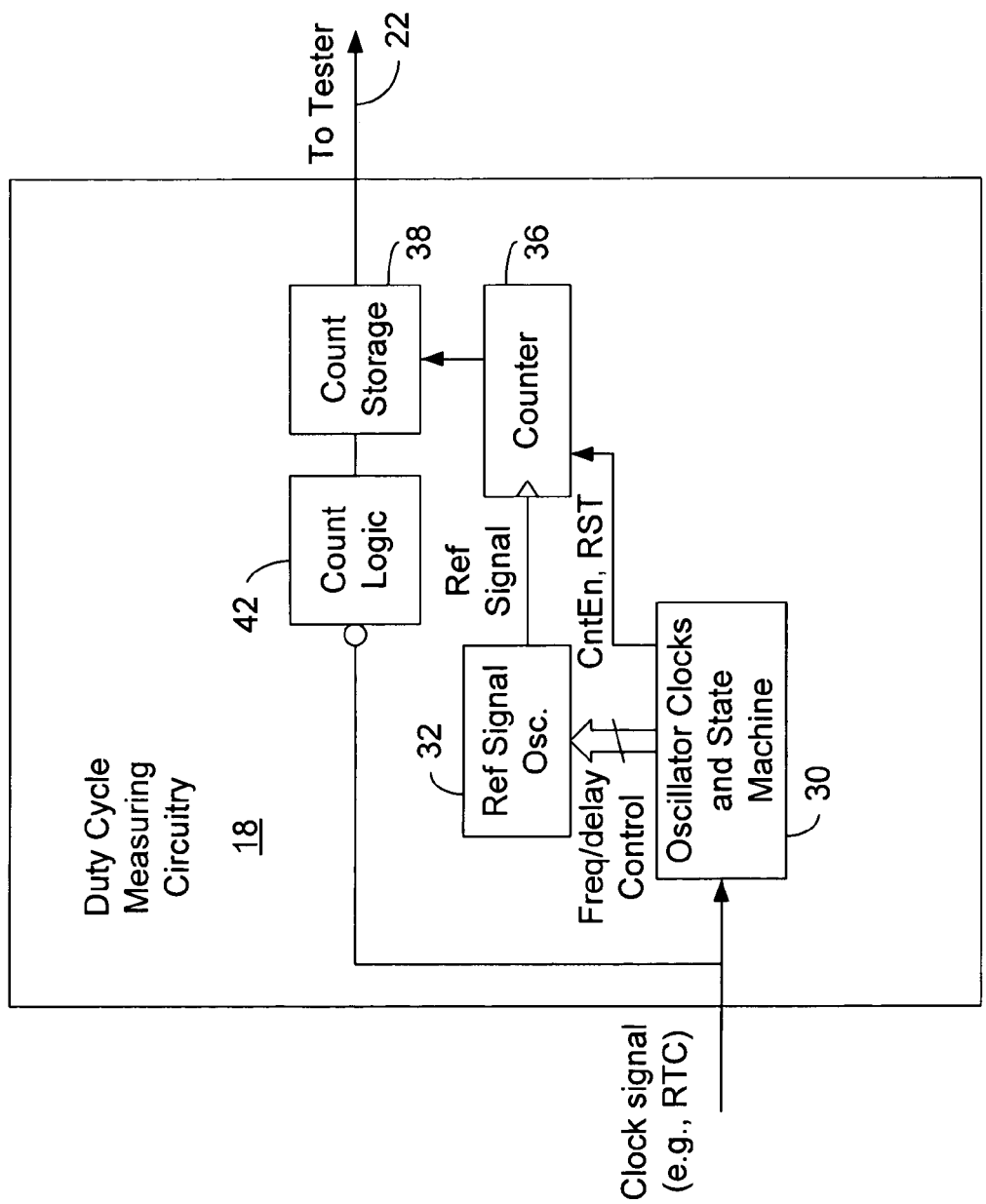
FIGS. 3-5 are each a block diagram representation of details of the duty cycle measuring circuitry of FIG. 1 according to some embodiments of the inventions.

FIG. 3 illustrates details of some embodiments of duty cycle measuring circuitry 18, but the invention is not limited to the details shown in FIG. 3. The clock signal from clock generation circuitry 12 is received by oscillator clocks and state machine 30, which may include a digital delay locked loop that locks to the clock signal. Oscillator clocks and state machine 30 provides a control signal to a reference signal oscillator 32 to control the generation of the reference signal. An example of the reference signal generated by reference signal oscillator 32 is shown in FIG. 2. The control signal may be viewed as a frequency control signal or a delay control signal. For example, the control signal may increase or decrease of delay of the reference signal produced by oscillator 32. The reference signal and the clock signal may be single ended or differential.

The reference signal is received at the clock input of counter 36. Counter 36 starts counting in response to an asserted count enable (CntEn) signal and stops counting in response to a reset signal (RST) (which may be one combined signal) from oscillator clocks and state machine 30. Counter then restarts with another asserted count enable signal. Count storage circuit 38 stores the count value of counter 36 at various times in different registers. Count storage circuit 38 includes a register(s) from which a tester (FIG. 6) can read through conductors 22. Count logic 42 receives the clock signal and controls count storage circuit 38. There are various way in which the oscillator clocks and state machine 30, counter 36, count storage circuit 38, and count logic 42 may operate.

In some embodiments, in response to a low to high transition of the clock signal (e.g., time t3 of FIG. 2), oscillator clocks and state machine 30 asserts the reset and count enable signals so that counter 36 is reset and starts counting. In addition, in response to a low to high transition of the clock signal (e.g., time t3 of FIG. 2), count logic 42 causes count storage circuitry 38 to read the count of counter 36 just before it is reset. Oscillator clocks and state machine 30 does not assert the reset and count enable signals again until another low to high transition of the clock signal (e.g., at time t6 of FIG. 2). However, count logic 42 causes count storage circuit 38 to read the count value of counter 36 in response to a high to low transition of the clock signal (e.g., at time t4 of FIG. 2). Accordingly, count storage circuit 38 holds a number of counts for the entire period (total count) of the clock (low to high to the next low to high) and a number of counts while the clock signal is high (high count). Count logic circuitry 42 can manipulate count values to compute a duty cycle ratio from the ratio of high count to total count. At least some of the contents of count storage circuit 38 is made available to an external tester (e.g., shown in FIG. 6) through conductors 22.

In some embodiments, the number of counts while the clock is low (low count) may be used. It can be obtained from subtracting the high count from the total count. In some embodiments, the operation is the same as mentioned above, but the reset and count enable signals are asserted in response to high to low transitions. In some embodiments, the low count and not the high count is computed. The ratio of one or more of the following can be computed and stored in count storage circuitry 38: the ratio of high count to low count, low count to high count, low count to total count, and/or high count to total count, and/or their inverses.

In other embodiments, the circuitry operates similarly, but the reset and count enable signals are asserted in response to both low to high (e.g., at time t3) and high to low (e.g., at time t4) transitions of the clock signal. Count logic 42 causes the count storage circuit to read the count value just prior to each transition thus obtaining the low count and the high count. The total count (if used) can be obtained by adding the low and high counts. In some embodiments, the total count is not used. One or more of the ratios mentioned above can be computed and stored in count storage circuitry 38.

In still other embodiments, counter 38 is not reset, but count logic 42 computes differences to obtain low, high, and/or total counts in response to low to high and high to low transitions. In some embodiments, there is more than one counter like counter 36. For example, in FIG. 5, counter(s) 62 may include more than one counter. One counter may count the total count and another may count the high count and the low count. Alternatively, one may count the low count and the other the high count. A third counter may count the total count.

Figure 4:
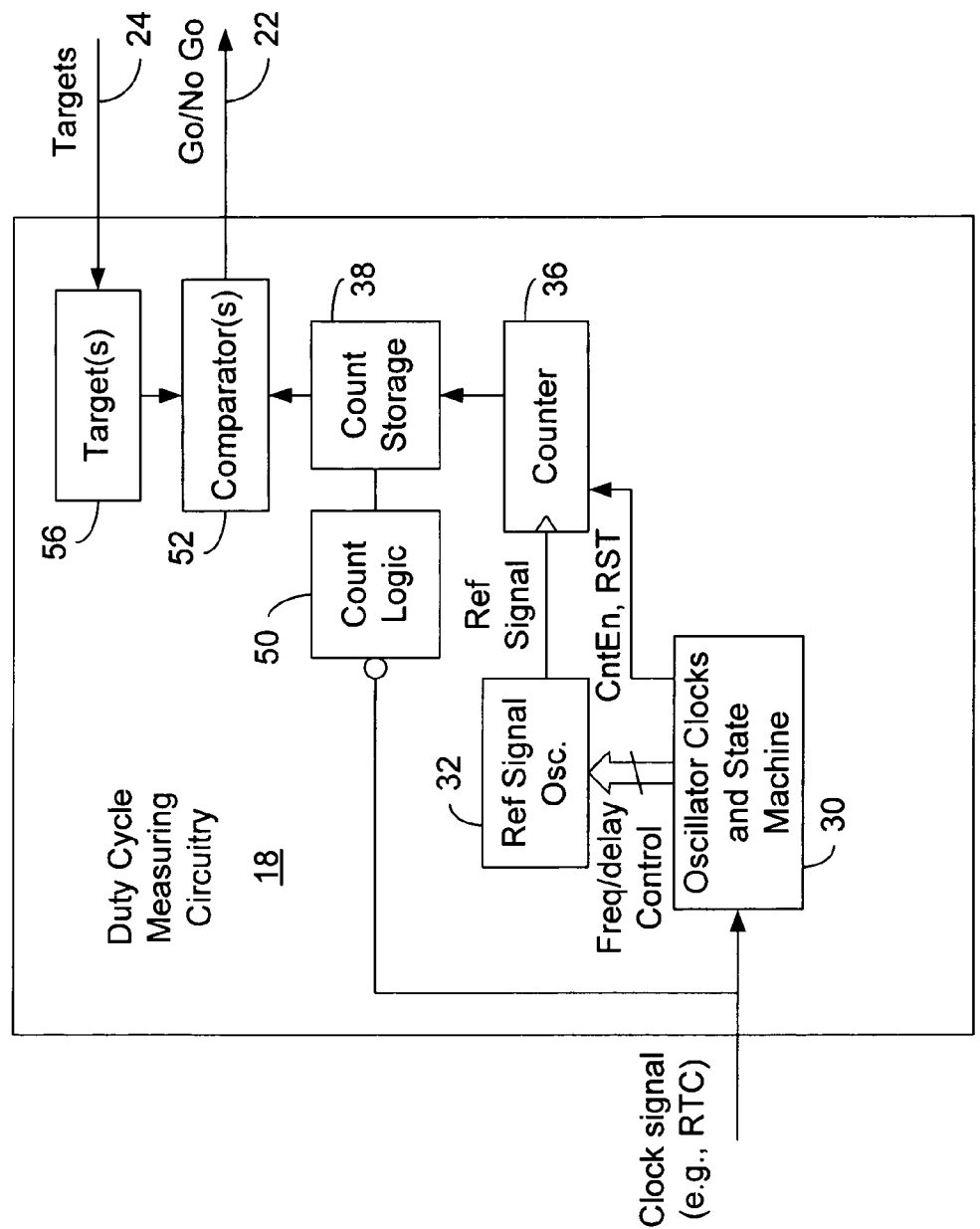

FIG. 4 shows an alternative arrangement for duty cycle measuring circuitry 18. In FIG. 4, one or more count values and/or ratios is compared by comparator(s) 52 with one or more target count values, target ratios, and/or ranges from target storage circuit 56. For example, assume that a 30% to 70% duty cycle is acceptable. If the clock signal of a particular chip has a 45% duty cycle, that is an acceptable duty cycle, then the comparison would indicate an acceptable chip. If the clock signal of a particular chip has a 20% or an 85% duty cycle, that is an unacceptable duty cycle, and the comparison would indicate an unacceptable chip. In some embodiment, there are comparisons of measured duty cycle ratio to high and low target ratios. In other embodiments, there are comparisons of low count to low target count (target phase) and high count to high target count. Target storage circuit 56 may hold high and low ratios and/or high and low absolute count values. In some embodiments, the result of the comparison(s) is read immediately by an external tester and in other embodiments, it is stored in a register (e.g., in count storage circuit 38) for later reading by the external tester. Count logic 50 may be like count logic 42 or somewhat different. Ratios can be computed by count logic 42, 50, or 60 (in FIGS. 3, 4, and 5) or by an external tester.

There are various ways in which the target values can be stored in target storage circuit 56. For example, they may be hardwired into storage circuit 56, or they may be provided externally through conductors 24. There may be intermediate circuitry between duty cycle measuring circuitry 18 and conductors 22 and 24 on the outside of chip 10.

Figure 5:
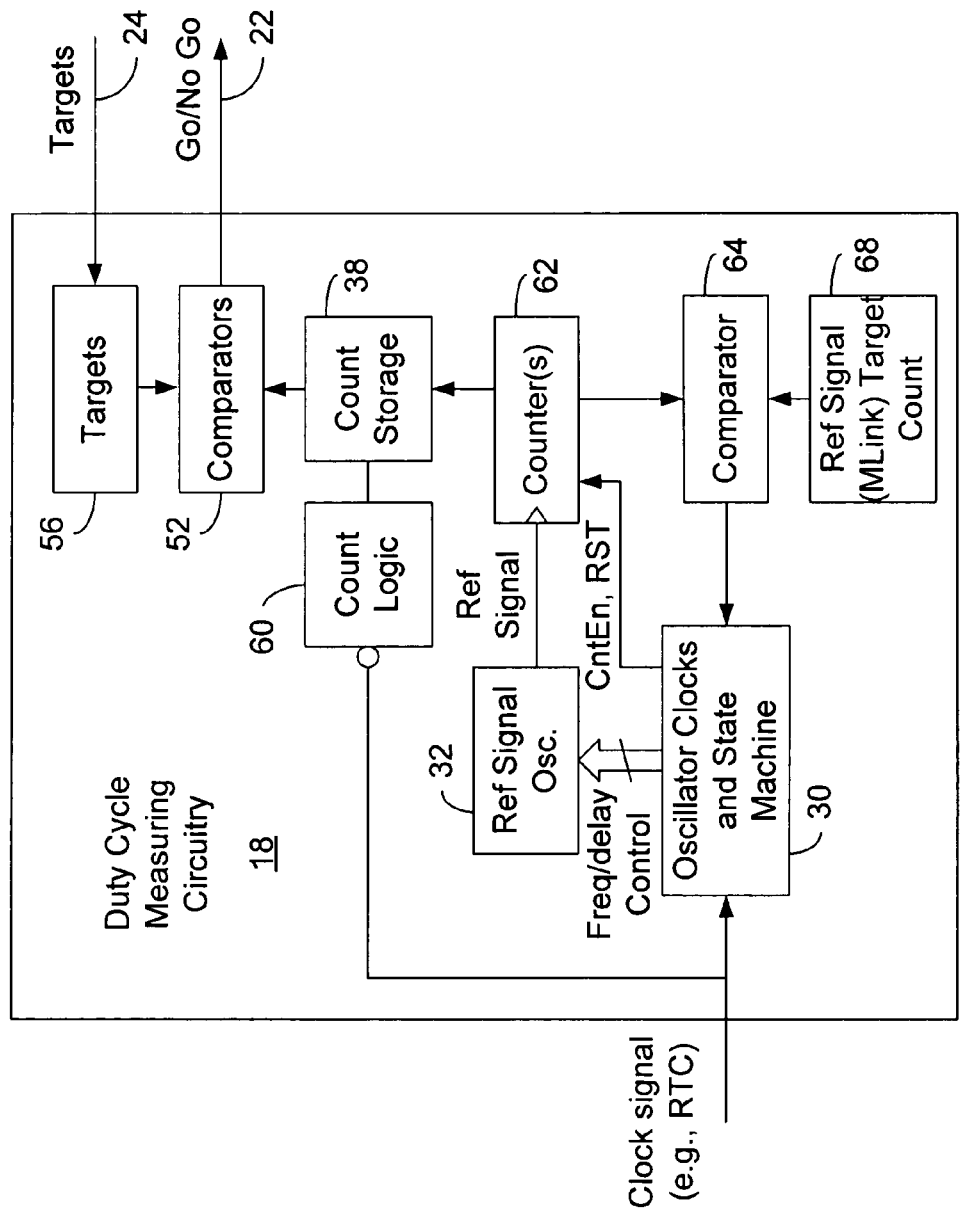

FIG. 5 shows yet another alternative design for duty cycle measuring circuitry 18. As noted, counter(s) 62 include one or more counters like counter 36. The examples of FIGS. 3 and 4 may also include more than one counter. An advantage of having more than one counter is that as one counter is resetting, the other can be ready to count. In some embodiments, two clocks are used to separately count high and low portions of the clock signal. In such a case, an MLink bypass clock can be provided by a tester. This may be done to avoid the more complex clock and signal crossing from the MLink oscillator logic to the register and comparator.

In FIG. 5, a comparator 62 compares the count of counter 36 to a target amount from reference signal (e.g., MLink) target count circuitry 68. The result of the comparison is provided to oscillator clocks and state machine 30 for various purposes, one of which may be to provide some feedback regarding the reference signal, although this is not the case of some embodiments.

Figure 6:
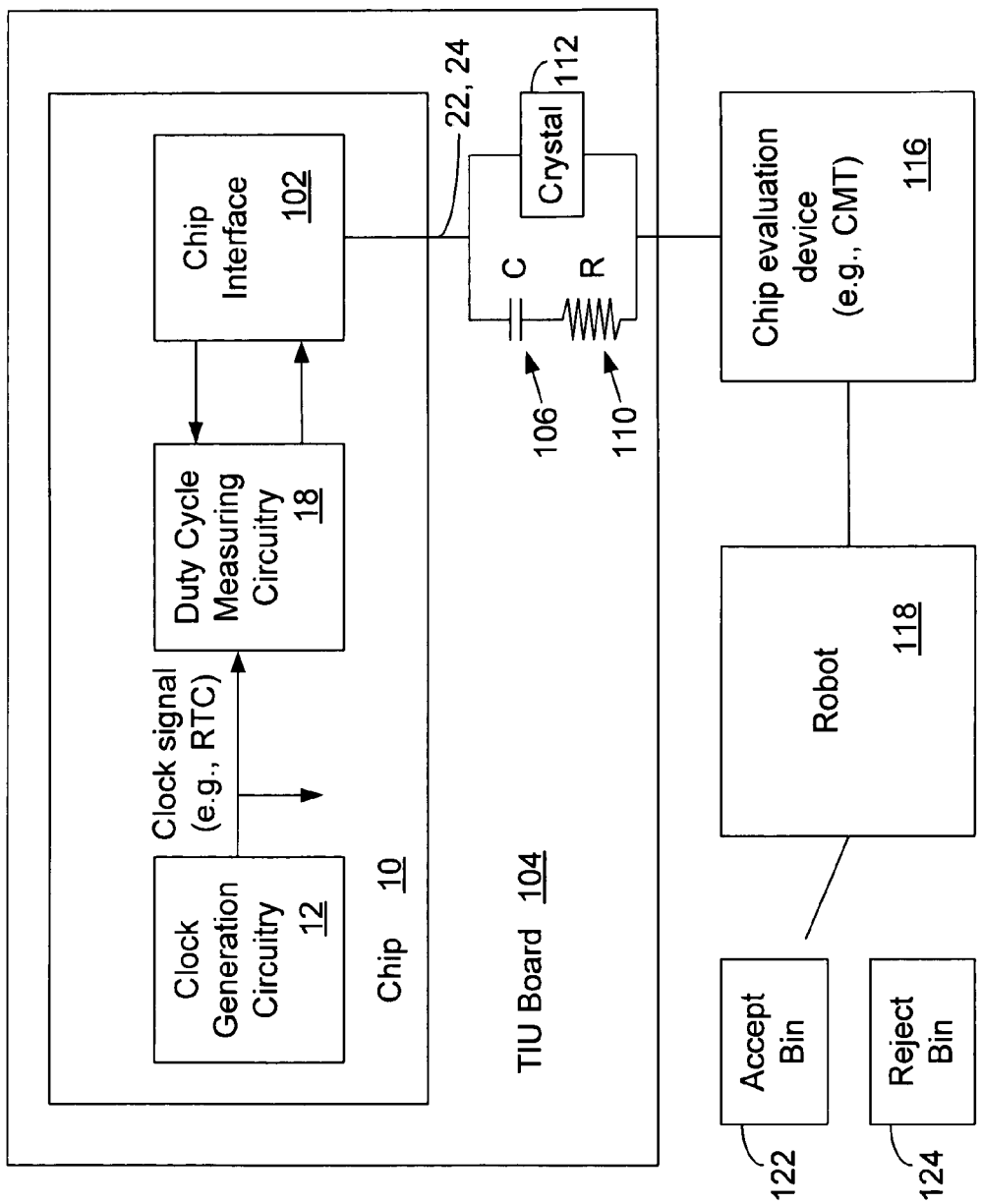
FIG. 6 is a block diagram representation of a system in which the chip of FIG. 1 may be tested.

FIG. 6 gives an example of chip 10 in a test system, but some or all of the details are not used in other systems. In FIG. 6, chip 10 includes chip interface circuitry 102 to interface between conductors 22 and 24 and duty cycle measuring circuitry 18. Chip 10 is on a circuit board of a test interface unit (TIU) 104. Conductors 22, 24 include a capacitor 106 of capacitance C and a resistor 110 of resistance R to emulate the resonance condition of clock generation circuitry 12. In some embodiments, a piezoelectric crystal 112 is used in place of or in combination with capacitor 106 and resistor 110. Capacitor 106 and resistor 110 are shown in parallel with crystal 112, but in practice, the RC or crystal may be used so they are not in parallel. The method can be used to determine system margins by understanding the impact of different crystals on the board that are connected to good, working parts.

A chip evaluation device (tester) 116 reads the ratio data and/or comparison result data and decides whether to accept or reject chip 10. Tester 116 instructs a robot 118 to place the chip in an accept bin 122 or a reject bit 124. In some embodiments, there are more categories than merely accept or reject. In some embodiments, tester 116 is a configurable modular tester (CMT) such as is sold by Advantest Corporation, but various other testers including custom testers may be used.

In some embodiments, the operation performed by FIG. 3, 4, or 5 is be repeated multiple times to insure consistent results.

The following describes procedures that can be used in some embodiments, but is not required in other embodiments. The number of periods of a higher frequency clock in the measured clock period is compared to the number of periods of the higher frequency clock in either the high or low phase of the measured clock. The ratio of the two is compared to high and low limits for pass/fail. If the number of higher frequency clocks per measured clock is known, then only the number of clocks in high or low phase needs to be compared against the limits. The number of periods of a higher frequency clock in the low phase of the measured clock and the number of periods of the higher frequency clock in the high phase of the measured clock are captured. If the expected number of clocks per period is roughly known, then the difference of the smaller from the larger phase can be compared to a test limit, otherwise the ratio of the two is compared to high and low limits for pass/fail.

Some of these methods may be based on measuring time through frequency ratios. Time measurement schemes using delay lines or similar time-ratio methods may be analogously applied in some embodiments.

In some embodiments, a state machine may keep the count of the number of rising edges of the reference clock (e.g., MLink oscillator 32) in one period of the clock signal (e.g. RTC) and adjusts the MLink Oscillator to meet a known count. This may meet the first requirement for the method above (i.e., The number of periods of a higher frequency clock in the measured clock period is compared to the number of periods of the higher frequency clock in either the high or low phase of the measured clock.)

During a pre-production development stage, the duty cycle of the RTC clock may be measured and understood across different process, voltage and temperature corners. This characterization data may be analyzed and used to set test limits for the RTC duty cycle in a separate test register. A design for test mode may be implemented to compare the actual duty cycle to the expected duty cycle set based on silicon characterization data across process, voltage, temperature (PVT). Tests developed to compare the actual duty cycle of the RTC clock versus the expected duty cycle on every single die may be implemented in sort and class high volume manufacturing (HVM) testing in production to screen for good and bad units. This can be used to correlate to fabrication manufacturing process parameters.

Technology existing prior to the inventions of this disclosure included an oscillator clocks and state machine, MLink oscillator, counter, comparator, and MLink target count circuitry similar to oscillator clocks and state machine 30, Ref signal oscillator 32, counter 36 or 62, comparator 64, and reference signal target count circuitry 68. Accordingly, some embodiments of FIG. 3 involve adding the additional circuitry of FIG. 3 to these already existing components.

Chip 10 may be used for a wide variety of purposes such as being a microprocessor, communication chip, chipset, memory, to name only a few.

The inventions are not restricted to any particular type of signaling. The input and clock signals can be single ended or differential. The clock signals and other signals may include "eyes." The clocking can be single data rate, double data rate, quad data rate, etc. In double data rate, a rising falling edge of a single clock signal may be used, or two out of phase clocks may be used. The signals may be packetized or non-packetized.

This disclosures includes various figures that are schematic in nature and do not include various details. In actual embodiments, the systems and chips would include additional components that are not illustrated including between circuitry illustrated in the figures. The illustrated components may have various additional inputs and outputs. Various algorithms and methods described herein may be performed in hardware circuitry without or without the assistance of firmware or software. However, firmware and/or software may be used in overall systems in which the algorithms and methods are performed.

As used herein, the term "embodiment" refers to an implementation of one or more of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. Different references to "some embodiments" do not necessarily refer to the same "some embodiments."

If the specification states a component, feature, structure, or characteristic "may", "might", or "could" be included, that particular component, feature, structure, or characteristic is not required to be included. If the specification or claim refers to "a" structure, that does not mean there is only one of the structure.

While the invention has been described in terms of several embodiments, the invention should not limited to only those embodiments described, but can be practiced with modification and alteration within the spirit and scope of the appended claims. The description is thus to be regarded as illustrative instead of limiting.

What is claimed is:

1. A chip comprising:
   clock generation circuitry to create a clock signal;
   reference signal oscillator circuitry to produce a reference signal with a higher frequency than the clock signal;
   a counter to change a count value in response to changes in the reference signal; and
   count logic circuitry to cause count storage circuitry to read the count value in response to at least some changes in the clock signal and to make at least some of the values in the count storage circuitry related to a duty cycle of the clock signal available to an external tester.

2. The chip of claim 1, wherein the count logic circuitry manipulates at least some of the stored count values to provide signals indicative of a duty cycle of the clock signal, and wherein the signals indicative of a duty cycle of the clock signals are stored in the count storage circuitry and made available to the external tester.

3. The chip of claim 1, further comprising a target storage circuit to store target values related to high and low acceptable duty cycles, and comparison circuitry to compare values in the count storage circuitry with the target values and place results in the count storage circuit to be available to the external tester.

4. The chip of claim 3, wherein the target values include count values.

5. The chip of claim 3, wherein the target values include duty cycle ratio values.

6. The chip of claim 1, wherein the changes in the clock signal include low to high transitions and high to low transitions.

7. The chip of claim 1, wherein the counter count value is incremented in response to a rising edge of the reference signal.

8. The chip of claim 1, wherein the first clock signal is a real time clock (RTC) signal.

9. The chip of claim 1, wherein the reference signal is a MLINK signal.

10. The chip of claim 1, wherein comprising an additional counter to provide count values in response to changes in the reference signal that are provided to the count storage circuitry.

11. A chip comprising:
clock generation circuitry to create a clock signal;
reference signal oscillator circuitry to produce a reference signal with a higher frequency than the clock signal;
a counter to change a count value in response to changes in the reference signal;
count logic circuitry to cause count storage circuitry to read the count value in response to at least some changes in the clock signal;
a target storage circuit to store target values related to high and low acceptable duty cycles, and comparison circuitry to compare values in the count storage circuitry with the target values.

12. The chip of claim 11, wherein results of the comparison is placed in the count storage circuit to be available to the external tester.

13. The chip of claim 11, wherein the comparison is made with different values in the count storage circuitry.

14. A system comprising:
a tester;
a chip coupled to the tester, the chip including:
clock generation circuitry to create a clock signal;
reference signal oscillator circuitry to produce a reference signal with a higher frequency than the clock signal;
a counter to change a count value in response to changes in the reference signal; and
count logic circuitry to cause count storage circuitry to read the count value in response to at least some changes in the clock signal and to make at least some of the values in the count storage circuitry related to a duty cycle of the clock signal available to the tester.

15. The system of claim 14, wherein the count logic circuitry manipulates at least some of the stored count values to provide signals indicative of a duty cycle of the clock signal, and wherein the signals indicative of a duty cycle of the clock signals are stored in the count storage circuitry and made available to the external tester.

16. The system of claim 14, further comprising a target storage circuit to store target values related to high and low acceptable duty cycles, and comparison circuitry to compare values in the count storage circuitry with the target values and place results in the count storage circuit to be available to the external tester.

17. The system of claim 14, further comprising oscillator clock and state machine circuitry to provide a reset signal and a count enable signal to the counter responsive to changes in voltage of the clock signal.

18. The system of claim 14, wherein the counter count value is changed in response to a rising edge of the reference signal.

19. The system of claim 14, wherein comprising an additional counter to provide count values in response to changes in the reference signal that are provided to the count storage circuitry.

20. The system of claim 14, wherein the chip is on a test interface unit board and a piezoelectric crystal on the board is coupled in series with a conductor between the chip and the tester.

* * * * *